(12) United States Patent
Lin et al.

(10) Patent No.: US 6,942,026 B2
(45) Date of Patent: Sep. 13, 2005

(54) FIN ASSEMBLY OF HEAT SINK

(75) Inventors: Kuo-Len Lin, Wugu Township, Taipei County (TW); Sharng-Fu Lui, Wugu Township, Taipei County (TW)

(73) Assignee: Golden Sun News Techniques Co., Ltd., Taipei (TW)

( * ) Notice: Subject to any disclaimer, the term of this patent is extended or adjusted under 35 U.S.C. 154(b) by 0 days.

(21) Appl. No.: 10/724,770

(22) Filed: Dec. 2, 2003

(65) Prior Publication Data

US 2005/0115702 A1 Jun. 2, 2005

(51) Int. Cl.[7] .................................................. F28F 3/08
(52) U.S. Cl. ..................................... 165/185; 165/80.3
(58) Field of Search ................................ 165/185, 182, 165/80.1–80.5

(56) References Cited

U.S. PATENT DOCUMENTS

| | | | | |
|---|---|---|---|---|
| 6,340,056 B1 | * | 1/2002 | Huang et al. ............... | 165/185 |
| 6,449,160 B1 | * | 9/2002 | Tsai ........................... | 165/80.3 |
| 6,607,028 B1 | * | 8/2003 | Wang et al. ................ | 165/185 |
| 6,619,381 B1 | * | 9/2003 | Lee ............................ | 165/80.3 |
| 6,639,802 B1 | * | 10/2003 | Dong et al. ................. | 165/185 |
| 6,644,386 B1 | * | 11/2003 | Hsu ........................... | 165/80.3 |
| 6,644,397 B1 | * | 11/2003 | Shen ......................... | 165/185 |
| 6,754,079 B1 | * | 6/2004 | Chang ....................... | 165/80.3 |
| 2003/0116304 A1 | * | 6/2003 | Ho et al. ................... | 165/80.3 |
| 2004/0159421 A1 | * | 8/2004 | Wang ........................ | 165/80.3 |

* cited by examiner

*Primary Examiner*—Teresa J. Walberg

(57) ABSTRACT

A fin assembly for a heat sink has a plurality of metal plates stacked with each other. Each metal plate has a body member and a plurality of connecting structures protruding perpendicularly from the body member. Each body member is perforated with a plurality of through holes. Each connecting structure further has a partitioning part and a latching pert extending from the partitioning part, the latching part is aligned with the corresponding through hole. Each latching part of each metal plate is inserted through the corresponding through hole of the metal plate placed in front. The latching part inserted through the corresponding through hole of the metal plate placed in front is bent as a hook. Preferably, each body member includes a top folded edge and a bottom folded edge along an elongate direction thereof, and the top and bottom folded edges are perpendicular to the body member.

10 Claims, 5 Drawing Sheets

FIN ASSEMBLY OF HEAT SINK

FIELD OF THE INVENTION

The present invention relates in general to a fin assembly of a heat sink, and more particularly, to a fin assembly of which a plurality of fins are hooked with each other.

BACKGROUND OF THE INVENTION

The fast development of computer industry increases the operation speed of electronic devices, and consequently generates more heat. To maintain an allowable operating temperature of the electronic devices, heat sinks with larger areas are applied to the surface of the electronic devices for heat dissipation.

However, the area of the conventional heat sink made by aluminum extrusion or press process is restricted due to mechanical process. To provide more efficient heat dissipation, the weight of the heat sink is consequently increased. Therefore, the heat sink normally includes a plurality of relatively light-weight fins stacked and fastened with each other to provide more areas for heat dissipation.

FIG. 1 shows a perspective view of a conventional fin assembly. The fin assembly includes a plurality of metal plates 10a formed with a specific shape and size by mechanical press. Each metal plate 10a can be fabricated from aluminum or copper and includes a fin body 11a, a bottom edge and a top edge. The fin bodies 11a are secured to each by connecting structures 12a as shown in FIG. 2. Each of the connecting structures 12a includes a fastening part 120A and a connecting part 121a. The fastening parts 120a extend perpendicularly from the top edge of the corresponding fin body 11a. The connecting part 121a of each fin body 11a is perforated with a through hole 122a allowing fastening part 120a of the adjacent fin body 11a to engaged therewith.

The above connecting structure provides proper firmness and stability of the fin assembly 1a. However, as the rigidity of the fin assembly 1a is too high, the plasticity is relative poor. Therefore, the fin assembly 1a is easily damaged by impact.

Further, the bottom surface of the fin assembly 1a is limited to a planar configuration. Therefore, the applicability of such fin assembly 1a is limited.

SUMMARY OF THE INVENTION

The present invention provides a fin assembly of a heat sink. The fin assembly includes a plurality of metal plates secured to each other by hook formed integrally with the metal plates. Therefore, the connecting strength and stability of the fin assembly can be enhanced.

The present invention further provides a fin assembly with a bottom surface configurable to fit with surface profile of a heat sink or an electronic device. Therefore, the applicability of the fin assembly is enhanced.

The fin assembly provided by the present invention comprises a plurality of metal plates stacked with each other. Each of the metal plates comprises a body member and a plurality of connecting structures protruding perpendicularly from the body member. Each of the body members is perforated with a plurality of through holes. Each of the connecting structures comprises a partitioning part and a latching part extending from the partitioning part, the latching part is aligned with the corresponding through hole. Each latching part of each metal plate is inserted through the corresponding through hole of the metal plate placed in front. The latching part inserted through the corresponding through hole of the metal plate placed in front is bent as a hook. Preferably, each body member includes a top folded edge and a bottom folded edge along an elongate direction thereof, and the top and bottom folded edges are perpendicular to the body member.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF DRAWINGS

These, as well as other features of the present invention, will become more apparent upon reference to the drawings wherein.

DETAILED DESCRIPTION OF THE PREFERRED EMBODIMENTS

Figure 1:
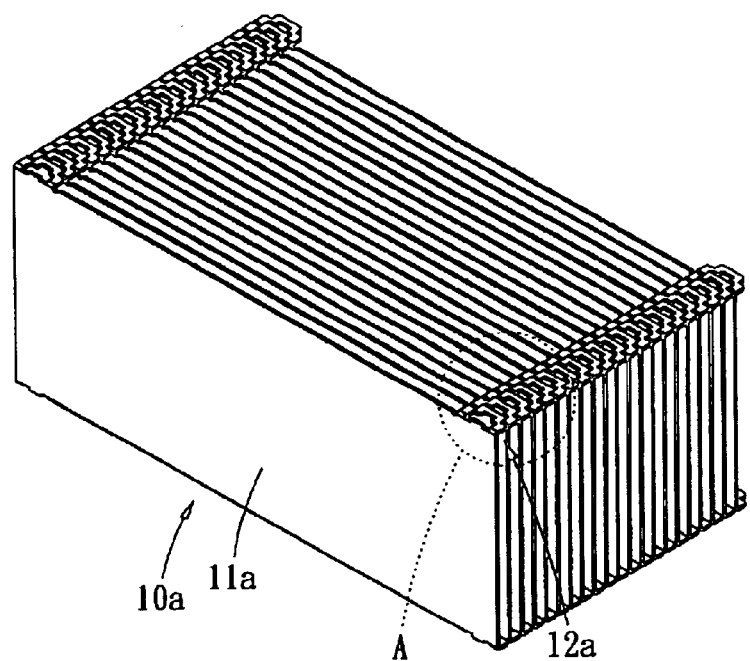
FIG. 1 shows a conventional fin assembly.
Figure 2:
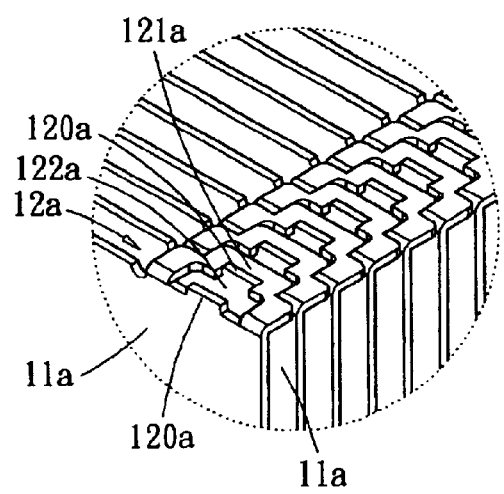
FIG. 2 shows a local enlargement of FIG. 1.

Reference will now be made in detail to the preferred embodiments of the present invention, examples of which are illustrated in the accompanying drawings. Wherever possible, the same reference numbers are used in the drawings and the description to refer to the same or like parts.

Figure 4:
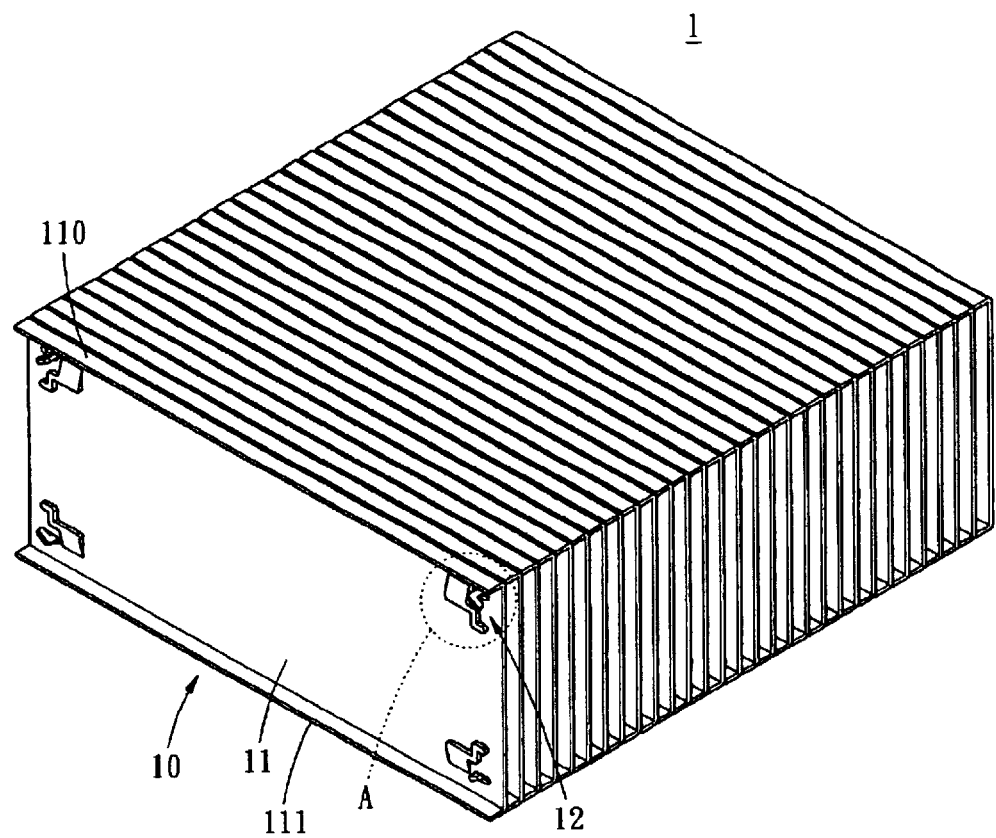
FIG. 4 shows a perspective view of the fin assembly of metal plates.

As shown in FIG. 4, the present invention provides a fin assembly of a plurality of metal plates 10 arranged in parallel to each other. Each of the metal plates 10 has a configuration and size fabricated by mechanical fishing press. The configuration includes open rectangular, L-shape, and I-shape cross sections, for example. In this embodiment, each metal plate 10 includes a body member 11 and two folded edges 111 and 112 extending perpendicularly from two opposing elongate edges of the body member 11. It will be appreciated that people skilled in the art may modify the metal plates 10 with various configurations other than the open-rectangular, L-shape and I-shape cross sections without exceeding the spirit or scope of the present invention.

Figure 3:
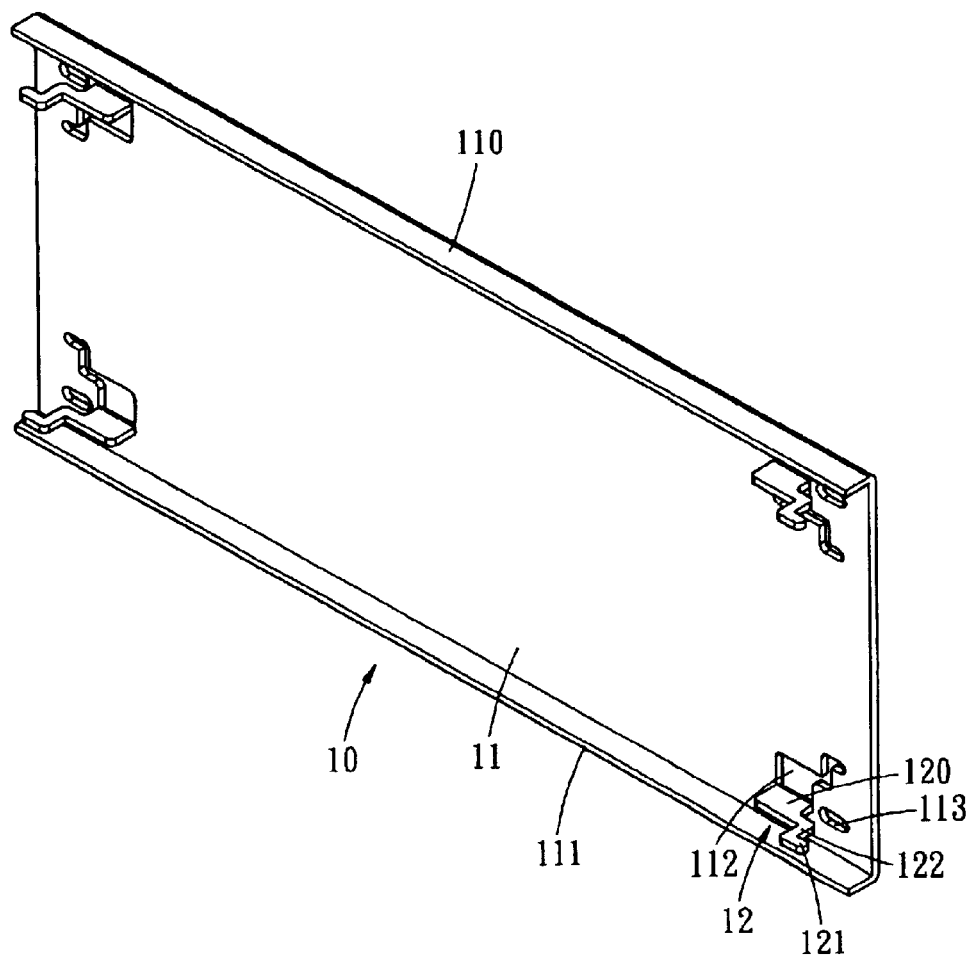
FIG. 3 shows a perspective view of a metal plate.
Figure 5:
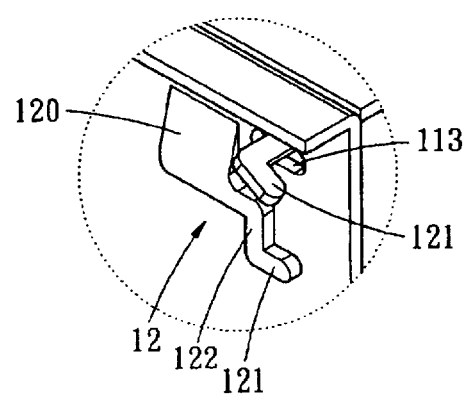
FIG. 5 shows an enlarged view of portion A as shown in FIG. 4.

As shown in FIGS. 3–5, each of the metal plates 10 includes a plurality of connecting structures 12. In this embodiment, the connecting structures 12 are located at four diagonal corners of the body member 11 of each metal plate 11. It is clearly shown in FIG. 5 that the connecting structures 12 are a part of the body members 11, that is, the connecting structures 12 are integrally formed with the body members 11 during the mechanical press process. Preferably, each of the connecting structures 12 includes a plate pressed open from the corresponding body member 11. The plate protrudes perpendicularly from the body member 11. As a result, a press hole 112 conformal to the plate is formed in the body member 11. In this embodiment, the plate comprises a partitioning part 120 and a latching part 121 extending from the partitioning part 120.

Figure 6:
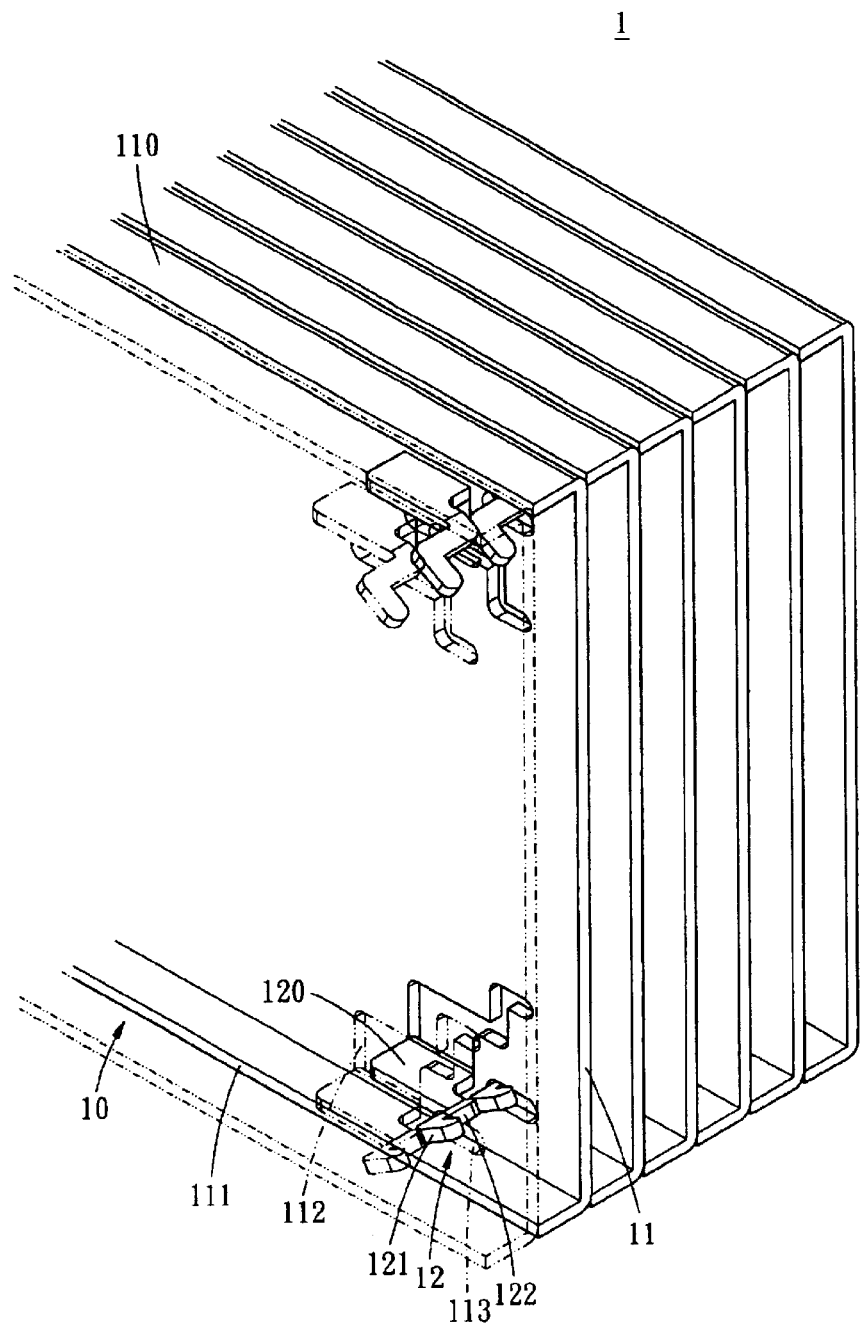
FIG. 6 shows the connection of the metal plates.

As mentioned above, each of the plates can be bent perpendicular to the body member 11 after being pressed open therefrom. The partitioning part of the plate reserves a required space between neighboring metal plates 10. Each of the body members 11 is further perforated with a through hole 113 aligned with the latching member 121 thereof. The number of the through holes 113 is preferably no less to the number of the connecting structures 12. As shown in FIG. 6, to secure the metal plates 10 with each other, the latching members 121 are inserted through the corresponding through holes 113 of the immediately adjacent metal plate 10. The latching members 121 protruding from the adjacent metal plate 10 are then bent as hooks by a tool to secure the metal plates 10 to each other.

Thereby, a fin assembly of a heat sink is formed.

Figure 7:
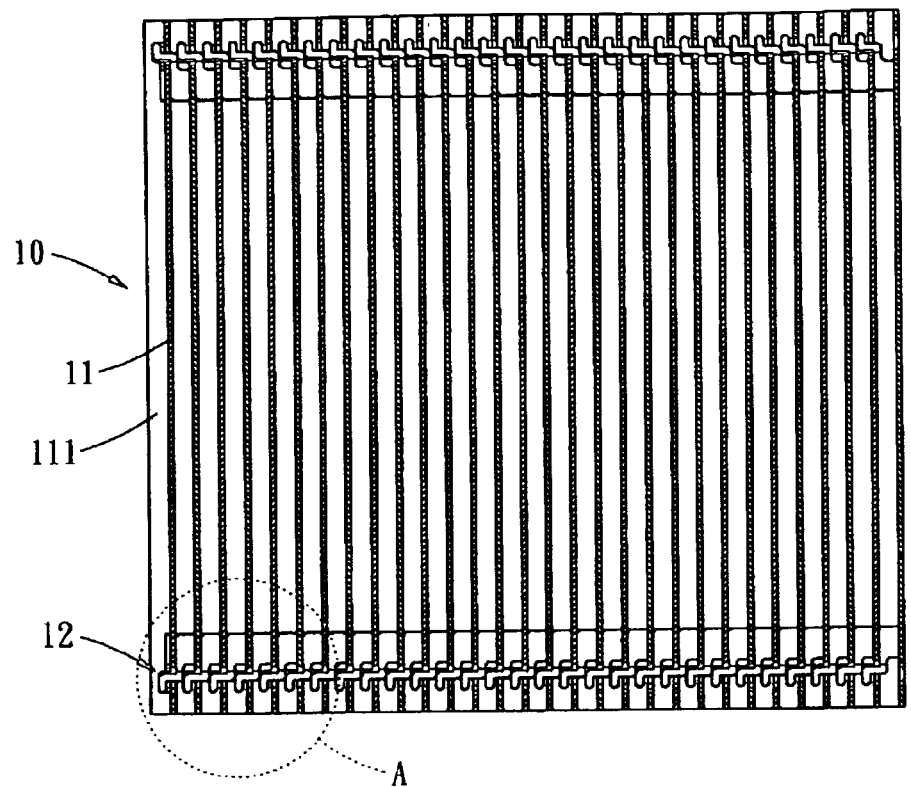
FIG. 7 shows a top view of the fin assembly.
Figure 8:
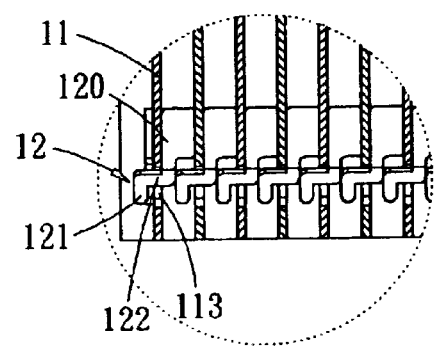
FIG. 8 shows the enlarged view of portion A as shown in FIG. 7.

As shown in FIGS. 7 and 8, each connecting structure 12 further comprises a connecting part 122 between the partitioning part 120 and the latching member 121. The length of the connecting parts 122 can be adequately adjusted according to the thickness of the body member 11 and the required width of the space between the neighboring metal plates 10. When the length of the connecting part 122 is the same as the thickness of the body members 11, the partitioning part 120 and the latching part 121 will be closely adjacent to the body member 11 of the neighboring metal plate 10. As a result, a firmly stacking effect is obtained. Alternatively, the length of the connecting part 122 can be longer than the thickness of the body member 11 to result in property flexibility. Therefore, the bottom surface of the fin assembly 1 can be curved into various configurations.

Further, the connecting structures 12 use the latching members 121 to hook up the body member 11 of the neighboring metal plate 10 in front at the through holes 113, the frontmost metal plate 10 does not require the connecting structures 12, or the connecting structures 12 does not need to protrude from the body member 10 thereof.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

What is claimed is:

1. A fin assembly for a heat sink, comprising a plurality of metal plates stacked with each other, each of the metal plates comprising a body member and at least one connecting structure protruding perpendicularly from one side of the body member, wherein the connecting structure comprises a partitioning part, a connecting part, whose length controls the flexibility of the fin assembly, and a latching part, where both the connecting part and the latching part extending from the partitioning part, the latching part is aligned with the corresponding through hole of the metal plate placed in front where the body members is perforated with at least one through hole, wherein the length of the connecting part of all engaging metal plates is longer than the thickness of the adjacent front body member.

2. The fin assembly of claim 1, wherein the latching part inserted through the corresponding through hole of the metal plate placed in front is bent as a hook.

3. The fin assembly of claim 1, wherein each body member includes a top folded edge and a bottom folded edge along an elongate direction thereof.

4. The fin assembly of claim 3, wherein the top and bottom folded edges are perpendicular to the body member.

5. The fin assembly of claim 1, wherein each metal plate includes four connecting structures located at four diagonal corners of the body member thereof.

6. A fin assembly for a heat sink, comprising a plurality of metal plates stacked with each other, each of the metal plates comprising a body member and at least one connecting structure protruding perpendicularly from one side of the body member, wherein the connecting structure comprises a partitioning part, a connecting part, whose length controls the flexibility of the fin assembly, and a latching part, where both the connecting part and the latching part extending from the partitioning part, the latching part is aligned with the corresponding through hole of the metal plate placed in front where the body members is perforated with at least one through hole, wherein the connecting part of metal plates having various lengths are used in the fin assembly so that the bottom of the fin assembly is flexible and can be adapted to fit the non-flat surface of a heat generating device.

7. The fin assembly of claim 6, wherein the latching part inserted through the corresponding through hole of the metal plate placed in front is bent as a hook.

8. The fin assembly of claim 6, wherein each body member includes a top folded edge and a bottom folded edge along an elongate direction thereof.

9. The fin assembly of claim 8, wherein the top and the bottom folded edges are perpendicular to the body member.

10. The fin assembly of claim 6, wherein each metal plate includes four connecting structures located at four diagonal corners of the body member thereof.

* * * * *